United States Patent [19]

Mundt

[11] Patent Number: 5,463,526
[45] Date of Patent: Oct. 31, 1995

[54] HYBRID ELECTROSTATIC CHUCK

[75] Inventor: Randall S. Mundt, Pleasanton, Calif.

[73] Assignee: Lam Research Corporation, Freemont, Calif.

[21] Appl. No.: 184,707

[22] Filed: Jan. 21, 1994

[51] Int. Cl.[6] .................................................. H02N 13/00
[52] U.S. Cl. ........................................ 361/234; 361/230
[58] Field of Search ................................... 361/230, 233, 361/234; 269/8, 903; 279/128

[56] References Cited

U.S. PATENT DOCUMENTS

| | | | |
|---|---|---|---|
| 4,184,188 | 1/1980 | Briglia | 361/234 |
| 4,665,463 | 5/1987 | Ward et al. | 361/234 |
| 4,667,110 | 5/1987 | Kariya | 361/234 |
| 4,692,836 | 9/1987 | Suzuki | 361/234 |
| 4,962,441 | 10/1990 | Collins | 361/234 |
| 5,001,594 | 3/1991 | Bobbio | 361/234 |
| 5,117,121 | 5/1992 | Watanabe et al. | 361/234 |
| 5,151,845 | 9/1992 | Watanabe et al. | 361/234 |
| 5,166,856 | 11/1992 | Liporace et al. | 361/233 |

*Primary Examiner*—Jeffrey A. Gaffin
*Attorney, Agent, or Firm*—Pennie & Edmonds

[57] ABSTRACT

An electrostatic chuck comprises a hybrid dielectric between a wafer and an electrode. The hybrid dielectric is comprised of two layers; a thin insulating layer for attracting and holding the bottom of the wafer; and a mechanically and electrically robust semiconducting layer below. The resistivity of the semiconducting layer can cover a wider range of values for equivalent performance than has been achievable heretofore with Johnson-Rahbeck effect devices. The hybrid layer combines the high force/voltage ratio and quick charge/discharge features of a thin insulating dielectric chuck with the protection provided by a current limiting semiconducting layer. The hybrid layer chuck provides improved performance with simple, low cost structures.

18 Claims, 5 Drawing Sheets

FIG. 5 ic CHUCK

BACKGROUND OF THE INVENTION

1. Field of the Invention

This invention relates to an electrostatic chuck for holding a work object and more particularly to a hybrid electrostatic chuck with a semiconducting layer and an insulating layer for holding a semiconductor wafer during integrated circuit fabrication.

Many of the process steps employed in the manufacture of integrated circuits require that the temperature of the wafer be actively controlled during processing. This is typically done by clamping or holding the wafer firmly against a chuck whose temperature can be controlled through the use of heaters or fluid flow channels embedded in the chuck or contacting the back surface of the wafer, or other means of controllably adding or removing thermal energy.

It is highly desirable that the method used to hold the wafer against the chuck provide a uniform, controllable force over the entire area of the wafer. In order to minimize possible particulate production and consequent contamination, it is desired that the clamping method minimize the number moving parts and only minimally contact or disturb the surface of the wafer.

Electrostatic (ES) forces have been used since the 1960s to hold paper and other light, thin materials onto flat surfaces. This technology has been applied in the semiconductor industry to the clamping of wafers since the 1970s. There are a number of commercially available semiconductor processing systems which utilize electrostatic clamping.

2. Description of the Prior Art

A number of different configurations for electrostatic clamping of wafers have been developed. If a voltage potential is applied between the wafer and a metallic electrode, an attractive force will be produced based on the applied voltage, the separation distance and the dielectric constant of the material separating the wafer and electrode.

There are two general categories of electrostatic configurations used: (a) capacitor-like structures using pure insulating dielectrics between the wafer and the electrode and (b) structures using semiconducting dielectrics.

(a) When the dielectric material separating the wafer and the electrode is a good insulator, mobile charge in the insulator is insignificant. The force depends on the electrostatic attraction of image charges on conductor layers at different potentials separated by insulating layers and can be calculated based on classical capacitor theory. The clamping force is determined primarily by the applied voltage and the spacing between the wafer and the conductors. The spacing is limited by the breakdown voltage of a given dielectric thickness and material.

The electrostatic forces for clamping develop quickly. Charge and discharge times are a function of the allowable displacement current through the dielectric to establish the desired potentials on the wafer and the conducting layers. Since the resistance of the conductors is low, the charge and discharge times can be short as they are controlled by the RC time constant of the charging circuit. Some consideration may be given to the rate of application of voltage to limit the currents such that the wafer will not be damaged. Since the discharge times are short, the attractive force is removed quickly, and wafers can be removed from the chuck easily and rapidly.

Generation of usable forces (e.g. 20 g/cm$^2$) at reasonable voltages (less than 1000 V) requires that the insulating dielectric be fairly thin (e.g. 0.002 inch). A single scratch, defect or breakdown in the layer destroys the ES potential thereby causing the wafer to be declamped. The difficulties encountered in producing and maintaining a large area, defect free layer are substantial.

(b) If the dielectric material is a good conductor of electricity, it will not allow a large potential difference to exist between the wafer and the underlying electrode. Little or no electrostatic force can be generated as a result.

When the material between the wafer and the electrode has an intermediate resistivity, however, i.e., when it is a semiconductor or semi-insulator, the attractive force occurs between surface charges in the dielectric and the work object. This is called the Johnson-Rahbeck (J-R) effect.

The applied potential across the semiconducting dielectric will result in some current flow, or charge movement within the material to establish the surface charge. This will have the effect of slowly (for a relatively highly resistive material) reducing the potential within the material while increasing it between the wafer and the top surface of the material. This is equivalent to gradually reducing the apparent or effective thickness of the material. The rate at which this occurs is dependent on the resistivity of the material and the apparent capacitance of the wafer/material interface. The clamping force achieved is essentially independent of the thickness of the material.

Figure 1:
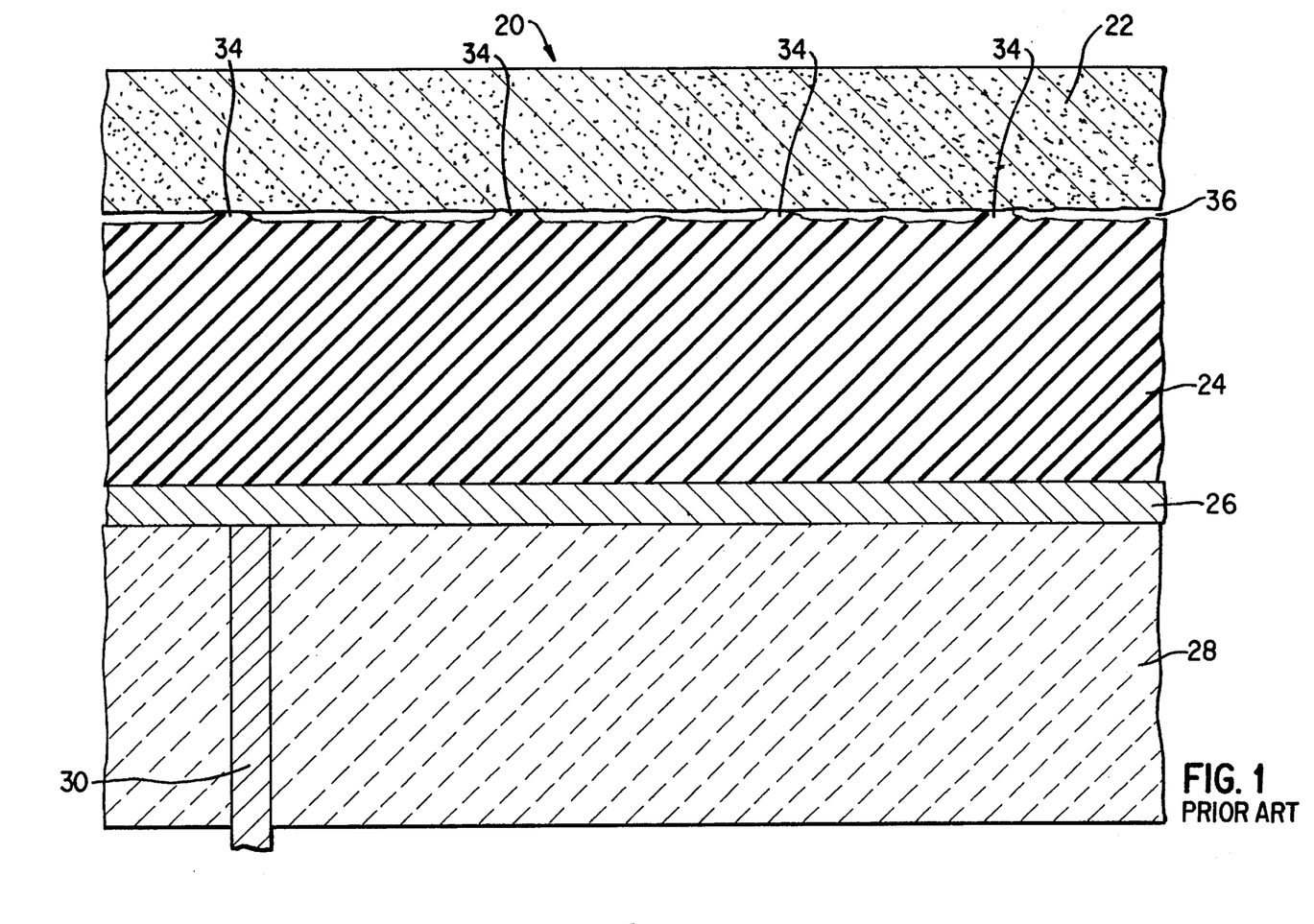
FIG. 1 is a schematic cross section of a segment of a conventional ES chuck.

The semiconducting dielectric structure makes use of the Johnson-Rahbeck effect to achieve high clamping forces at relatively low applied voltages. The Johnson-Rahbeck effect results from the use of a semiconducting or highly resistive material as the dielectric between the wafer to be clamped and a metallic electrode. FIG. 1 illustrates schematically the basic arrangement of a unipolar electrostatic chuck, denoted generally by the numeral 20.

The Johnson-Rahbeck effect depends on the ability of mobile charge in the dielectric to move adjacent to the interface between the dielectric and the wafer. This forms essentially a surface charge separated from the wafer only by the interface gap therebetween. The small spacing thereby gives high attractive forces at relatively low voltages compared to the insulating dielectric case.

Leakage currents can flow between the semiconducting dielectric and the wafer since mobile charge is present in the dielectric. The leakage current flowing will be a function of the impressed voltage across the dielectric and its resistivity. The magnitude of the leakage current must be limited to a value low enough to prevent declamping of the wafer from the chuck.

Since high potentials are developed between the conductive (somewhat) surface of the dielectric and the wafer, it is to be expected that current will flow between them. The microscopic rough textures of the real surfaces are separated by small gaps. At the points of contact there is indeed current flow and the potential (and thus the attractive forces) between the surfaces at these points drops to near zero. The high resistance of the dielectric material prevents this contact at localized points from discharging the entire surface of the dielectric material. The potential distribution across the surface of the dielectric will be nonuniform, but on average high, generating a high net clamping force.

Figure 2:
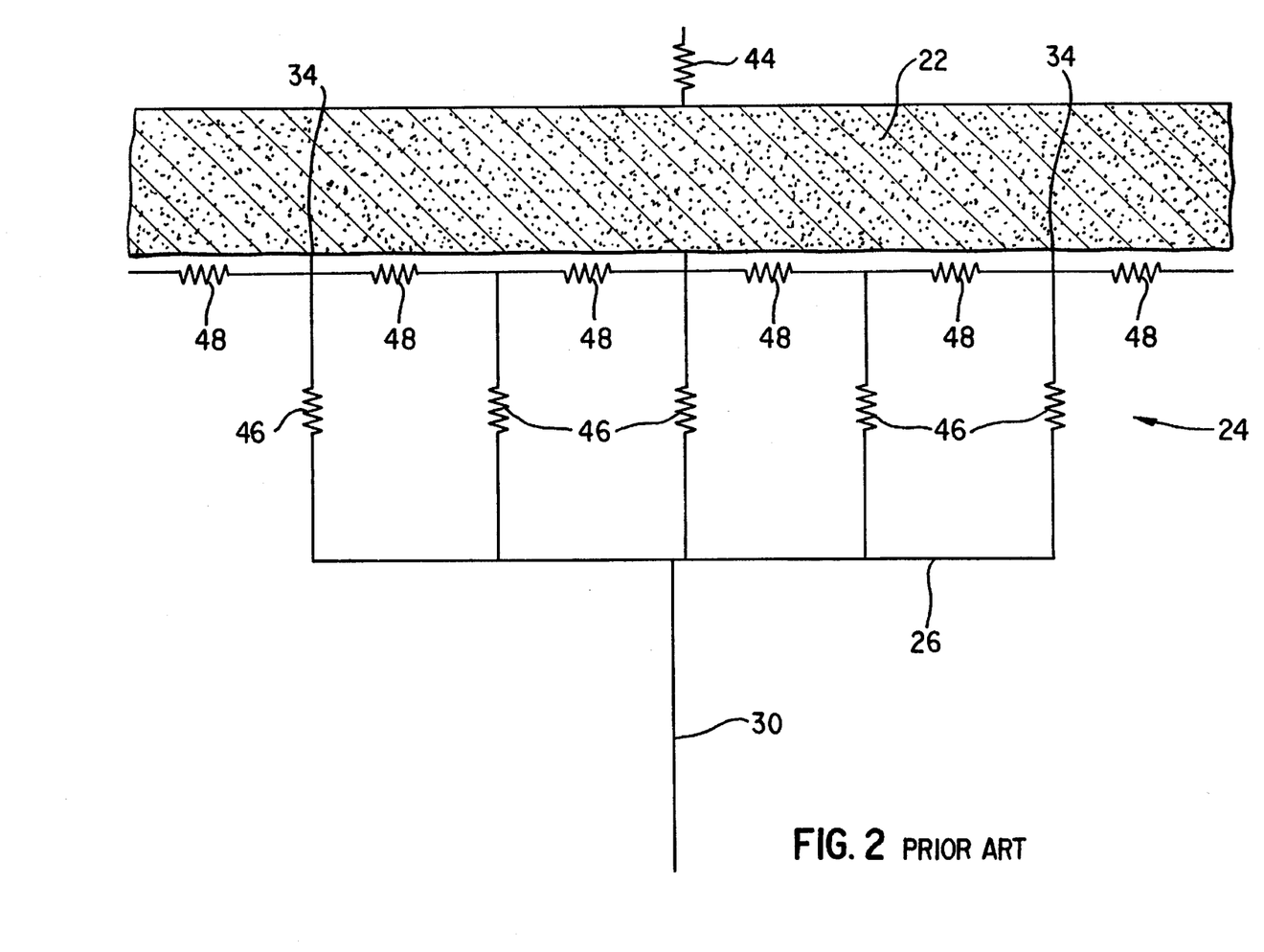
FIG. 2 is an electrical schematic of the ESC chuck shown in FIG. 1.

FIG. 2 is a schematic electrical equivalent circuit for the ES chuck shown in FIG. 1 where the dielectric layer is modeled with bulk and lateral resistance between adjacent contact points. This indicates how the interface between the wafer and the layer may still maintain a high average potential difference and thus a high attractive force.

The clamping characteristics of an electrostatic chuck (ESC) utilizing the Johnson-Rahbeck effect are thus strongly dependent on surface texture, average separation between points of contact, average gap between surfaces, surface electrical properties, presence of native insulating films, surface leakage paths, spacer material electrical properties, the temperature coefficient of resistance of the film, uniformity of resistance, etc.

These dependencies affect basic attributes such as magnitude of clamping force, magnitude and distribution of leakage currents through the wafer and time dependency of clamping and declamping forces.

The strength of the semiconducting approach is the ability to achieve high clamping forces while using thick, robust films. Operational problems result from the time dependencies of the forces and their sensitivity to small variations in composition, surface topology, temperature, etc.

Charge and discharge times depend on how long it takes for the mobile charge to move to and away from the interface between the dielectric and the wafer. These charging times are a function of the resistivity of the dielectric layer and the capacitance of the structure.

High resistivity corresponding to low leakage current tends to cause long charging times to develop the desired force. Long charging times mean that processing equipment must wait for the voltage and thus the ES force to be sufficient for the wafer to move to the next process step.

Long discharge times mean that attractive forces remain high for extended periods of time. It is therefore difficult to remove the wafer to transport it to the next step. This leads to additional loss of productivity in a manufacturing application.

Low resistivity of the dielectric material corresponds to short charging times but high leakage currents and possibly low clamping forces.

The resistivity of semiconducting materials varies as the exponential of 1/T, where T is the absolute temperature. High temperature lowers the resistivity to the point where large currents flow thereby reducing the voltage drop across the interface. Low temperature increases the resistivity to the point where charge and discharge times become unacceptable. The useful temperature range of the Johnson-Rahbeck effect is thus bound by considerations of leakage current limit and charging/discharging time limits as discussed above.

Both the insulating and semiconducting dielectric structures can be implemented in either a unipolar or bipolar configuration. Unipolar means one electrode separated from the wafer by a dielectric, bipolar means two (or more) electrodes separated from each other and the wafer by a dielectric.

With reference to FIG. 1, an exemplary embodiment of a unipolar electrostatic chuck (ESC) is denoted by the numeral 20. A wafer 22 is placed in contact with the upper surface of the ESC. The ESC includes a dielectric layer 24 formed on top of a conducting layer 26. The conductor 26 and dielectric layer 24 are supported by a base 28. A connection 30 to a high voltage power supply (not shown) is provided to the conducting layer 26.

As indicated in FIG. 1, the wafer 22 and dielectric 24 make direct contact at only a few points 34. The vertical scale of the surfaces is greatly exaggerated for purposes of illustration. The number and spacing of the contact points 34 depends on parameters such as surface flatness, surface finish and the like. It is known that for conventional surface preparations such as grinding and polishing of the wafer 22 and the dielectric 24, the contact points are separated by distances on the order of millimeters.

At the points of contact, the voltage difference between the wafer 22 and the dielectric 24 is zero, thus the force at the point of contact is zero. Due to the high bulk and lateral resistivity of the dielectric 24, very low currents flowing into the contact will cause high electric fields and thus voltage drops to the surrounding regions. These voltage drops allow the potential difference to remain high over most of the wafer-dielectric area and thus to retain high average force.

Between and around the contact points 34 are a multiplicity of gaps 36. Depending on the environment, the gaps 36 may be filled by air, process or cooling gases such as helium, or alternatively, may sustain a vacuum. The gaps separate the wafer 22 and the dielectric 24 by small distances on the order of microns down to angstroms.

A potential difference between the wafer 22 and the ESC 20 causes attractive electrostatic (ES) forces between the image charges on the conductor layer 26 and the bottom of the wafer 22. As is well known, the force is proportional to the square of the potential difference and inversely proportional to the square of the separation distance.

In the case of the insulating dielectric, the separation distance is the combined thickness of the dielectric 24 and the effective thickness of the gaps 36. The exact voltage-force relationship is also a function of the value of the dielectric constant of the dielectric 24 and the gases in the gaps 36.

The attractive electrostatic force, F, for a unipolar structure with a dielectric chuck member, is expressed by the following equation:

$$F = \frac{V^2}{X_{gap} + d_{film}} \frac{*1}{\frac{X_{gap}}{\epsilon_0 \epsilon_{gap}} + \frac{d_{film}}{\epsilon_0 \epsilon_{film}}}$$

where $\epsilon_o$ is the dielectric constant of free space, $\epsilon_{film}$ is the dielectric constant of the dielectric film 24, $\epsilon_{gap}$ is the dielectric constant of the gas in the gaps 36, V is the voltage impressed across the conductor 26 and the wafer 22, $d_{film}$ is the thickness of the dielectric film 24, and $X_{gap}$ is the effective gap 36 between the dielectric film 24 and the wafer 22.

The application of a potential difference between the wafer 22 and the dielectric 24 via the conductor 26 and a connection to the wafer (not shown) causes charges within the wafer 22 to be attracted to charges in the dielectric 24 and the base conductor 26. If the dielectric 24 is an insulator with resistivity in the range of $10^{16}$–$10^{17}$ ohm-cm, essentially no mobile charge is present. Without mobile charge in the dielectric 24, the electrostatic forces on the wafer are limited to those provided by image charges in the conductor layer 26 and the bottom surface of the wafer 22. The ES force will again be given by the equation above.

It is apparent that the ES force for a given voltage can be increased by thinning the dielectric layer 24. This is limited to thicknesses of roughly 1 to 2 mils for voltages in the range of 1000 V by the dielectric breakdown of the layer 24.

Thin dielectric layers are subject to damage by particles and scratches from handling. Direct contact between the wafer and the supporting conductor through holes or scratches could lead to damage of the wafer and/or the equipment. Replacement and repair costs of new or refurbished chucks are also a factor. There is a need for a more robust configuration to avoid the costs associated with damage to such thin dielectric layers.

The addition of small amounts of acceptor or donor impurities to the dielectric 24 can adjust the resistivity to a desired level for providing mobile charge to take advantage of the Johnson-Rahbeck effect. In this case the effective spacing is just $X_{gap}$; thus the attractive force will be high at relatively low voltage.

Electrostatic chucks employing the Johnson-Rahbeck effect are disclosed in the prior art. An example of a Johnson-Rahbeck ES chuck is disclosed in Watanabe U.S. Pat. No. 5,117,121. Watanabe teaches ES chucks with bipolar or unipolar electrodes using alumina-titanium dioxide compound dielectric layers with a thickness of about 300 µm. Discharge times in the 5–15 second range and attractive forces of less than a few g/cm$^2$ are achievable by applying a reversal voltage of 1.5 to 2 times the charging voltage. An "eliminating voltage" control apparatus is required to apply and control the charging and reverse biasing voltages. The environmental conditions of use must be characterized and controlled to choose the optimum eliminating voltage and the timing and shape of the charge and discharge cycles in order to have repeatable wafer release times. This information is stored in and used by the control apparatus.

Variability in conditions during manufacturing can lead to loss of control and thereby productivity. The effects of the higher eliminating voltage in plasma equipment must also be considered due to possible undesired plasma discharge.

Hence, there is a clear need for a simpler means for achieving rapid release times using this technology.

Another example of an ESC using the Johnson-Rahbeck effect is disclosed in Watanabe U.S. Pat. No. 5,151,845. This patent teaches multiple dielectric layers separated by electrodes. The upper dielectric layer has a lower resistivity than the lower layer and switches select between the electrodes. The dielectric layers are about 300 µm thick. The upper layer is alumina doped with about 1% titanium dioxide to have a resistivity in the range of $10^{11}$ to $10^{12}$ ohm-cm from room temperature to 200 degrees C. The lower layer is doped with about 0.3% titanium dioxide to achieve the same resistivity range from 200 to 400 degrees C.

The appropriate layer is selected to achieve a Johnson-Rahbeck ES attractive force to the wafer depending on the temperature of operation.

The device in the '845 patent achieves increased temperature range at the cost of increased manufacturing complexity and additional operating apparatus (switches and controls). The range of resistivity is important to the use of this apparatus. Control of uniformity of resistivity in this range across large areas for films of this thickness is problematic.

Hence, there is a need for a simpler structure to achieve a wider operating temperature range without the need for tight resistivity control.

Another device using the Johnson-Rahbeck ESC is disclosed in Kariya U.S. Pat. No. 4,667,110. Kariya teaches a photoconductive layer interposed between the work piece, i.e., the wafer, and a dielectrically polarizable insulator layer. T-shaped electrodes are embedded in the insulator. The insulator is disclosed as having light transmissive capability. Voltages applied to the T-shaped electrodes cause polarization of the polarizable layer and thereby ES attraction to the wafer.

The workpiece would remain attracted to the insulator after the removal of voltage due to residual polarization of the insulator. The addition of the photoconductive layer provides a means for discharging the polarization. The photoconductive layer is switched between a high resistivity and a low resistivity condition by a light source. The photoconductive layer is also composed of light transmissive materials. The photoconductive layer has its conductivity modified by the light source to shield the workpiece from the residual electrostatic force of the polarizable photoconductor and the electrodes for easy removal.

The requirement of materials having light transmissivity and the additional light source is a disadvantage and an additional encumbrance.

The Johnson-Rahbeck effect is used because charges can closely approach the wafer-insulator surface producing high forces across the wafer-insulator gaps at low voltage. The disadvantage of this is the charging time constant and the limited temperature range for clamping and for limiting the current. The points of actual contact cause potentially damaging leakage current limited only by the bulk resistivity of the insulator. At low resistivity voltage drops are low and currents are high, and at high resistivity time constants are long and wafer removal is difficult and problematic.

The clamping force is closely related to the resistivity of the semiconducting dielectric. High resistivity films in the $10^{11}$ and $10^{12}$ ohm-cm range are difficult to control closely across large areas. This causes an uneven clamping force across the wafer area, and thus uneven heat transfer. For applications which depend on tight wafer temperature control, this effect can be a disadvantage.

Electrostatic chucks employing insulating dielectrics have been disclosed in the prior art. The ES effect is used because mobile charges moving in the dielectric are not necessary, as ES forces are produced by charge imaging in the conductive wafer and the reference electrode(s). Forces are limited by the thickness of the dielectric separating the wafer and the conductive support for the insulator. Films thin enough to be useful are easily damaged by particles or in handling.

Bobbio U.S. Pat. No. 5,001,594 teaches an ESC having interdigitated conductors embedded in a dielectric. The conductor spacings are adjusted to cause no net field on the top surface of a wafer placed on top of the dielectric. The low net field effect depends on the geometry of the conductor and dielectric spacing and wafer thickness, and not on the material properties. The dielectric in this invention can be a pure insulator.

The dielectric layer must be fairly thin, about 4000 angstroms, to achieve useful attractive forces at usable voltages.

The disadvantages of this structure lie in the complex interdigitated pattern required and use of a thin (about 4000 angstroms) dielectric layer. Layers of this thickness are subject to failure due to scratching or puncture. The dual electrode structure also divides the voltage by ½, thereby reducing the attractive force by ¼ due to the second order power relationship between force and voltage.

Other references such as Ward et al., U.S. Pat. No. 4,665,463; Collins U.S. Pat. No. 4,962,441; Briglia U.S. Pat. No. 4,184,188; Suzuki U.S. Pat. No. 4,692,836; and Liporate U.S. Pat. No. 5,166,856 teach other unipolar or bipolar electrode structures in different configurations. Charge retention and thin dielectric layers are used to achieve useful attractive forces. Provisions for overcoming residual retention forces to remove the workpiece are taught using means such as air blasts or physical means. Some references teach the use of high voltages, i.e., 3 kV and above, which can cause undesired arcing in plasma equipment.

In sum, there is no known ESC technology which does not suffer from substantial operational problems in semiconductor process applications. An insulating dielectric provides rapid charge and discharge because mobile charges do not have to move through high resistivity layers to establish the charge distribution required.

Johnson-Rahbeck devices require tight control of film resistivity and/or additional special equipment to control the discharge of the closely spaced layer charge.

Therefore, there is a need for an ESC device which eliminates or is less dependent on tight temperature and process control of the J-R layer. There is also a need for an ESC device which is less susceptible to scratches and handling damage of thin dielectric layers.

SUMMARY OF THE INVENTION

In general, it is an object of the invention to provide a hybrid electrostatic chuck dielectric which retains the primary advantages of both the insulating dielectric and the Johnson-Rahbeck effect and eliminates some of their shortcomings.

It is a further object of the invention to provide an ESC apparatus which decreases the susceptibility of the device to scratches and handling damage.

It is a further object of the invention to provide an ESC apparatus which decreases the necessity for tight control of the resistivity of the semiconducting layer.

It is a further object of the invention to provide ESC apparatus which provides effective clamping forces at relatively low voltages.

In accordance with the above objects and others that will be mentioned and will become apparent below, the present invention comprises:

an hybrid electrostatic chuck for electrostatically attracting and holding an object, comprising a first layer having top and bottom surfaces, the first layer consisting essentially of an insulating material with a bulk resistivity greater than around $10^{15}$ ohm-cm and a thickness between about 0.0005 inches and 0.005 inches, for attracting and supporting such object on its top surface;

a second layer having upper and lower surfaces, the second layer consisting essentially of a semiconductive material with a bulk resistivity between about $10^8$ ohm-cm and $10^{13}$ ohm-cm and a thickness greater than 0.005 inches, the upper surface of the second layer being in direct contact with the bottom surface of the first layer;

conductive supporting means for supporting the second layer and the first layer;

voltage supply means for applying an electric potential between such object and the second layer, whereby an attractive electrostatic force will be generated between such object and the chuck.

The second layer in the ESC may be composed essentially of aluminum oxide and titanium dioxide and the first layer may be composed essentially of aluminum oxide.

Alternatively, a bipolar electrostatic chuck with two electrodes can be realized. In this case the second layer is formed into at least two electrically isolated electrodes and an electric potential is applied between at least two electrically isolated electrodes.

BRIEF DESCRIPTION OF THE DRAWINGS

For a further understanding of the objects and advantages of the present invention, reference should be had to the following detailed description, taken in conjunction with the accompanying drawings, in which like parts are given like reference numerals and wherein.

DETAILED DESCRIPTION OF THE PREFERRED EMBODIMENT

Figure 3:
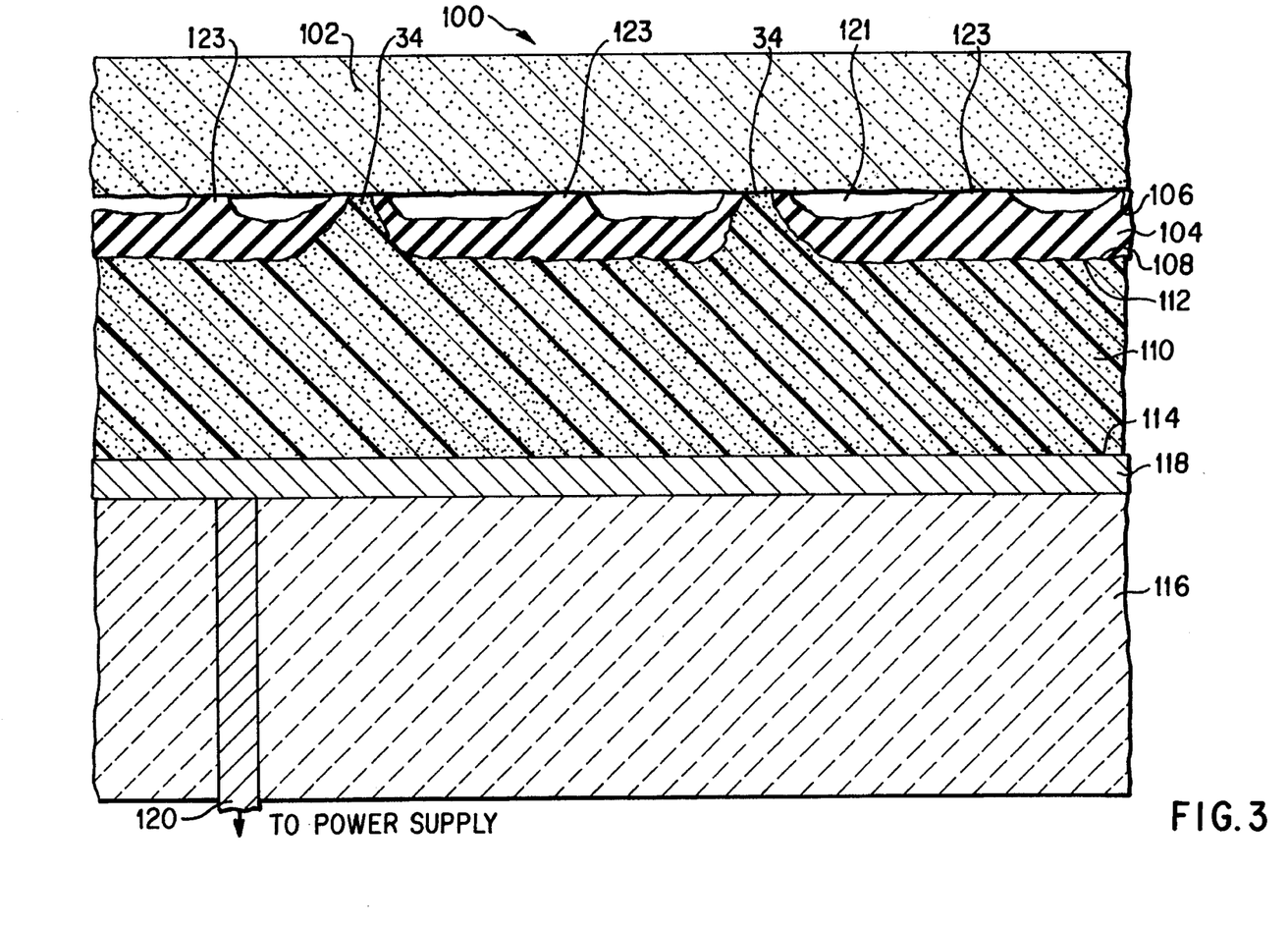
FIG. 3 is a schematic cross section of a unipolar hybrid ES chuck in accordance with this invention.

With respect to FIG. 3, a unipolar electrostatic chuck for electrostatically attracting and holding a wafer 102 is denoted generally by numeral 100. The chuck 100 has a thin top dielectric layer 104 made from an insulating material such as $Al_2O_3$. The thickness of layer 104 is between about 0.001 and 0.002 inches. The layer 104 has a top surface 106 and a bottom surface 108. The wafer 102 is placed in contact with the dielectric 104 top surface 106. The vertical scale is exaggerated to show the roughness of the surfaces and the limited number of points of contact.

The top layer 104 is formed onto an upper surface 112 of a thick semiconducting layer 110. The deposition and surface preparation of $Al_2O_3$ involve processes well known in the art such as evaporation, sputtering, CVD or the like.

The layer 110 is composed of a semiconducting material such as titanium doped alumina. The thickness of layer 110 is not critical. A layer that is thick enough to be impervious to scratching and mechanically robust is typically in the range of 0.005 to 0.050 inches or more. Thinner or thicker layers are possible depending on the specific requirements of an individual application within the bounds set by current limitations and heat transfer constraints.

A lower surface 114 of the layer 110 is contacted by a conducting layer 118 forming an electrode. An electrical contact 120 connects the conductive layer 118 to one terminal of a potential source such as a power supply (not shown).

A base 116 supports the layers 118, 110, 104 and the wafer 102.

A second electrical contact (not shown) provides electrical connection from the wafer 102 to the second terminal of the power supply (not shown). Wafer connections are made by means well known in the art such as clips, fingers or annular rings contacting the front side or the back side of the wafer. In the case of plasma equipment, electrical contact between the wafer and the second terminal of the power supply does not depend on mechanical means but is made through the plasma itself.

Unlike the implementations disclosed in previous devices using a semiconducting material in contact with the wafer, the potential difference exists across the upper insulating layer 104, rather than across gaps 121 which exist between the wafer 102 and the insulator 104 upper surface 106.

The semiconducting layer 110 allows electrical charges to move from the conducting layer 118 to the interface between the semiconductor layer 110 and the insulator layer 104 when a potential difference is established between the wafer 102 and the conductor 118 by the power supply.

The upper insulator layer 104 prevents current flow between the wafer 102 and the semiconductor layer 110 at points of contact 123. No current flows across the interface formed by gaps 121 between the wafer 102 and the insulator 104. Damage by punctures or scratches to layer 104 will permit the wafer 102 to contact the semiconducting layer 110 at damaged or scratched points 34. The limited number of points of damage permits the use of a much more conductive semiconductor material than could otherwise be used for the same application. The expanded limits of resistivity for layer 110 in accordance with this invention will be discussed further below.

Figure 4:
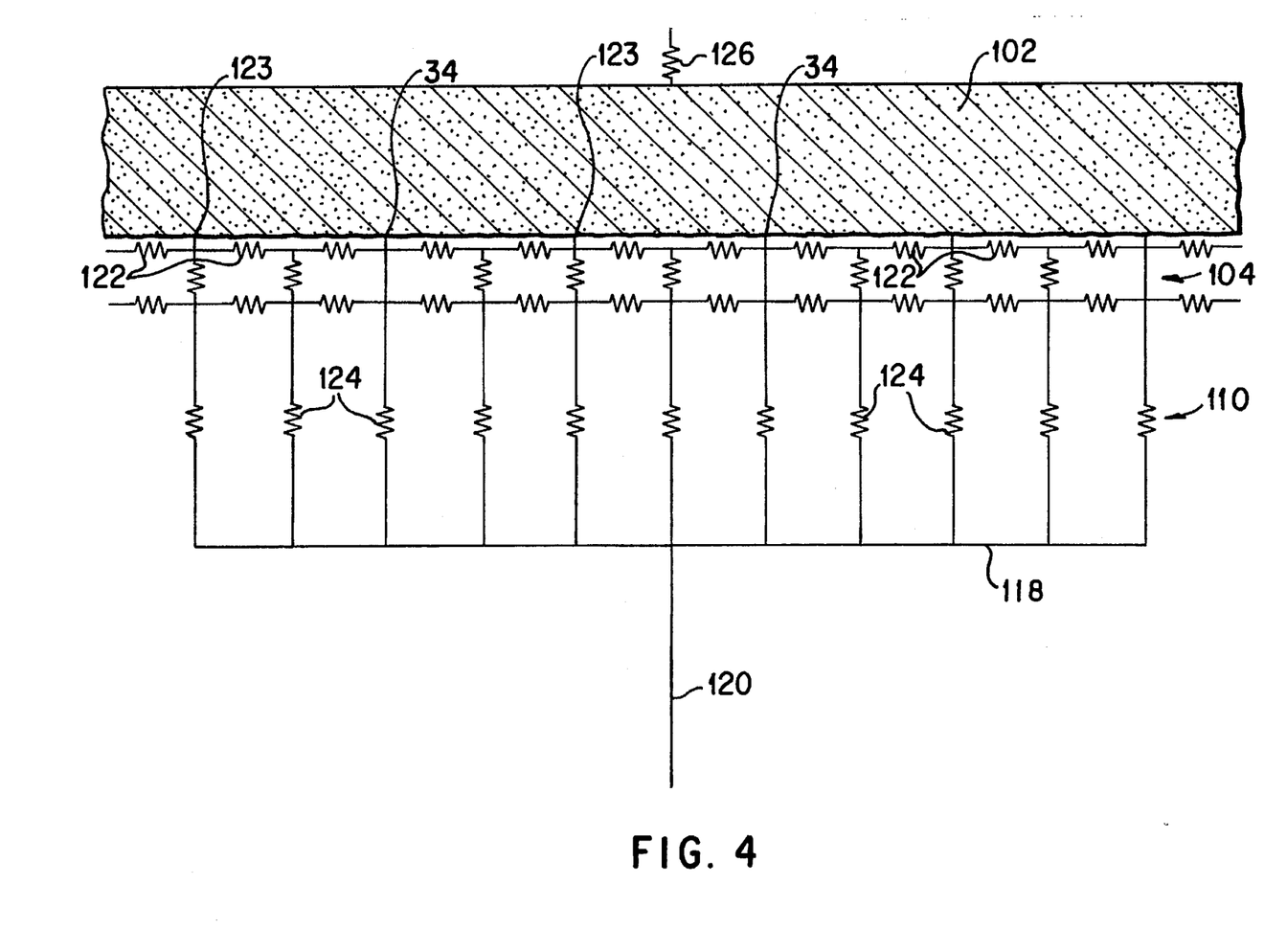
FIG. 4 is an electrical schematic of the hybrid electrostatic chuck of FIG. 3.

FIG. 4 is a schematic electrical equivalent of the ESC shown in FIG. 3. The wafer 102 and the current flowing to the wafer 102 at the limited number of contact points 34, is further limited by the lateral resistance represented by resistors 122 and bulk resistors 124 of the semiconducting layer 110.

The absence or reduction of current flow to the wafer by the presence of the insulating layer 104 in series combination with layer 110 in accordance with this invention protects the wafer from possible damage due to charge buildup or movement in or on the wafer.

The use of a relatively high conductivity material for layer 110 in accordance with this invention reduces the time dependencies of the clamping forces and minimizes variations due to composition, temperature, etc.

At the high conductivity limit of the semiconductor layer 110, it behaves as a metal and the system behaves like the insulating dielectric implementation with a thin dielectric layer. The thin dielectric layer 104 would be susceptible to breakdown and catastrophic failure.

At the low conductivity limit of the semiconductor layer 110, the system behaves as though there were a thick dielectric layer resulting in low attractive force and very long charge/discharge time.

An intermediate range exists in accordance with this invention wherein the resistivity of the semiconducting layer 110 is low enough to allow rapid, consistent force generation and removal yet still high enough to eliminate the catastrophic discharge and failure associated with defects or breakdown in the upper insulating layer 104. The resistivity of the semiconducting material of layer 110 is selected to provide rapid force development and removal while acting to limit the current and breakdown in the insulating layer 104. As the performance of the chuck 100 is no longer dependent upon maintaining a perfect, defect-free insulating layer, the layer 104 can be made substantially thinner than would otherwise be possible.

The combination of a thick, relatively low resistance semiconducting layer 110 and a thin, insulating layer 104 thus eliminates the major problems posed by using either one alone while retaining the advantages of each. The characteristics of this hybrid ESC system are:

1. A thick, mechanically robust semiconductor layer.
2. Insensitivity to minor damage and/or breakdown of the surface.
3. Rapid force clamping and declamping.
4. Relative insensitivity to layer composition, temperature, and surface conditions.
5. Minimal current flow into the wafer from the chuck.

The optimum resistivity of the semiconducting layer 110 is bounded by two considerations: (a) the time constant for force development and (b) the need to limit currents resulting from localized failures in the upper insulating layer 104.

The range of thickness of the upper layer 104 is similarly bounded at one end by the minimum acceptable force at reasonable voltages. The thickness range is bounded at the other end by the maximum acceptable leakage current allowable at the given defect density of the thin insulating layer 104.

It is useful to examine the bounds on the resistivity of the semiconducting layer. Usable forces of 20 g/cm² are achievable at voltages of about 1000 V. This voltage is sufficiently low to minimize corona discharge and the like in plasma equipment applications and allows the use of generally low cost open frame power supplies and conductors.

The optimum resistivity of the semiconductor layer 110 can be established as follows:

| | | |
|---|---|---|
| T = film thickness | 0.020 inches | ($5 \times 10^{-2}$ cm) |
| C — Wafer to chuck capacitance | 5 nF | ($5 \times 10^{-9}$ F) |
| $t_c$ — maximum time constant | 1 sec | |
| $I_p$ — maximum leakage current | 10 nA | ($1 \times 10^{-8}$ A) @ 400V |
| V — Applied voltage | 400V | |
| $A_c$ — Chuck area | 314 cm² | |
| $A_p$ — Point defect conduction area | cm² | |
| $R_p$ — Resistance of point defect | Ohm | |
| $R_c$ — Total resistance of bulk | Ohm | |
| $R_b$ — Bulk resistivity of material | Ohm-cm | |

Lower bound of $R_b$:

$$I_p = V/R_p$$

$$R_p = R_b * T/A_p$$

An estimate for $A_p$ is made by assuming conical current flow from a point defect at the surface through the thickness of the insulating film, ignoring current crowding effects.

$$A_p = (\pi * T^2)/2 = 3.9 \times 10^{-3} \text{ cm}^2;$$

$$R_p = R_b * 0.05/3.9 \times 10^{-3} = 12.8 \, R_b;$$

$$I_p \leq 1 \times 10^{-8} \leq 400/(12.8 \, R_b)$$

The lower bound for $R_b$ based on 10 nA allowed leakage, which is well below a damaging level for semiconductor devices, therefore is:

$$R_b \geq 400/(12.8 \times 10^{-8}) = 3.1 \times 10^9 \text{ Ohm-cm}$$

Upper Bound of $R_b$:

$$t_c = R_c * C;$$

$$R_c = R_b * T/A_c = R_b * 0.05/314 = 1.6 \times 10^{-4} * R_b$$

$$t_c \leq 1.6 \times 10^{-4} * R_b * 5 \times 10^{-9}$$

The upper bound for $R_b$ based on a time constant of 1 second or less, is then:

$$R_b \leq 1/(1.6 \times 10^{-4} \times 5 \times 10^9) = 1.3 \times 10^{12} \text{ Ohm-cm}$$

It is important to note that the upper and lower bounds of the resistivity of the semiconducting layer of the hybrid layer ESC in accordance with this invention are larger by several orders of magnitude than those in the prior art. This allows the use of a wider range of material properties or wider temperature range of operation with the same performance. The cost of ESC equipment in accordance with this invention is thereby reduced.

The upper and lower bounds may be greater or less than those calculated above based on different requirements for leakage current, film thickness, applied voltage, and stray capacitance as established in individual applications.

The bounds on the upper insulator thickness are set by the following considerations. The optimum thickness for the upper insulating layer thickness 104 cannot be based on basic material properties but must be determined by the defect density as a function of film thickness for the deposition method employed. Present data indicates that a thickness of roughly 0.001 to 0.002 inches will prove adequate at the current state of the art for thin films. Advances in the state of the art of film preparation will undoubtedly allow reduction in the allowable film thickness in the future.

An alternative embodiment of the present invention is a bipolar hybrid electrostatic chuck. With respect to FIG. 5, an alternate embodiment using a bipolar electrode structure is denoted by the numeral 200. The vertical scale is exaggerated for purposes of illustration.

Figure 5:
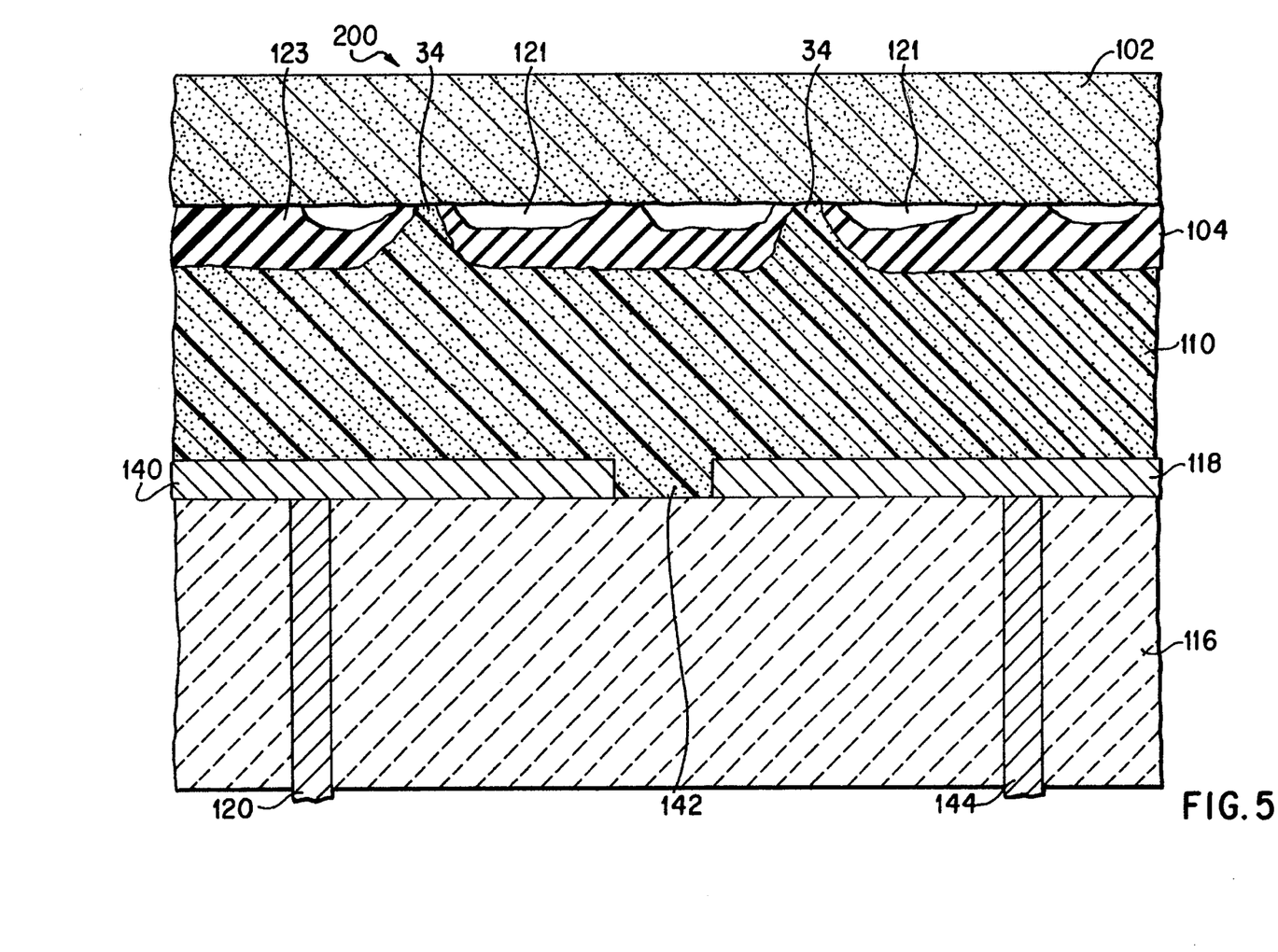
FIG. 5 is a schematic cross section of a bipolar hybrid ES chuck in accordance with this invention.

The ESC 200 has a top layer 104 of insulating material such as $Al_2O_3$, about 0.002 inches thick, supporting a wafer 102. The layer 104 is deposited on top of a suitably thick semiconducting layer 110 such as titanium-doped alumina of suitable resistivity according to this invention. The layer 110 has a thickness in the range of about 0.005 inches or more.

The bottom surface of layer 110 is contacted by multiple electrodes 118 and 140 separated by a gap 142. Electrical connections 120 and 144 are connected to opposite terminals of a power supply (not shown) which supplies a potential difference between the electrodes 120 and 140.

An insulating base 116 connects to the bottom of the electrodes 120 and 144 and forms the support for the ESC structure 200.

Electrostatic attraction between the wafer 102 and the ESC 200 is caused by the image charge induced in the bottom surface of the wafer 102 by the fringing field in the dielectric 104 between the wafer 102 and the electrodes 120 and 144. As is well known in electrostatics, the wafer 102 will charge up to a potential having a value intermediate between those of the two electrodes 120 and 144. The exact value of the potential of the wafer 102 relative to the electrodes 120 and 144 will depend on the relative ratio of the area overlap between the wafer 102 and the electrodes 120 and 144. To a first approximation, if the wafer 102 to electrode 120 and 144 overlaps are of equal area, the wafer 102 will charge to ½ of the potential difference between the electrodes 120 and 144. From the equation for electrostatic force above, the attractive force will be ¼ that of a unipolar structure. The applied voltage can be adjusted to achieve a suitable attractive force.

The bipolar embodiment is of significant advantage in some applications since it eliminates the necessity for direct electrical contact to the wafer.

In accordance with this invention, the bipolar embodiment 200 still provides the advantages of a thin insulating film 104 for high attractive force with low relative voltage. The wafer is simultaneously provided with the protective current limitation set by the high resistivity semiconductor layer 110 against the connection of the semiconductor layer 110 to the wafer 102 through the defects 34.

The high resistivity of the layer 110 allows it to bridge the electrically isolated electrodes 118 and 140 with no detrimental effect.

The base 16 can be of an insulating material such as a ceramic. The base 116 can be provided with a patterned conductive coating on top to form the electrodes 118 and 140. This approach would be particularly useful in high temperature applications.

The hybrid layer ESC of this invention allows the use of thin dielectric films 104 and 110 to achieve high clamping forces of greater than 20 $g/cm^2$ at moderate voltage of 500 to 1000 V without complex multi-layer electrode configurations or additional equipment. The materials used may be other than alumina/titania. For example, a conductive plastic material could be used as a semiconducting layer at low temperatures. The range of resistivity for the semiconducting layer 110 required for a given force, temperature range, and geometry is less restrictive than in the prior art.

The insulator layer 104 can be formed by any process-compatible, thin insulator, such as chemical vapor deposition (CVD) diamond. Alternatively, the insulating layer 104 can be formed by converting the top of the semiconducting layer 110 into an insulator. This may be accomplished, for example, by controlled oxidation of the semiconducting layer.

The thermal expansion coefficients of the alumina insulator layer 104 and titanium-doped alumina semiconducting layer 110 in accordance with the preferred embodiment of this invention are well matched. This reduces or eliminates problems of delamination, which are considerations in the prior art using multiple layers of significantly different thermal expansion coefficient characteristics.

The thickness of the lower semiconducting layer 110 should allow the stripping and redeposition of the top layer 104 thus allowing cost effective refurbishing of worn or damaged ESC chucks.

Cooling channels or passageways can be conveniently provided in the base 116 and up through the semiconductor layer 110 and insulating layer 104 without detracting from the advantages of this invention. Cooling fluids can then be provided to such channels to extract process generated heat, thus keeping the wafer within desired temperature bounds. Techniques for providing such channels and sealing such fluids from the process environment are well known in the art.

The advantages of high force generation with low voltage requirements in accordance with this invention particularly allow backside helium cooling to be used very effectively.

While the foregoing detailed description has described several embodiments of the hybrid electrostatic chuck in accordance with this invention, it is to be understood that the above description is illustrative only and is not intended to limit the disclosed invention. It will be appreciated that it would be possible to modify the materials selected, the shape and size of the insulating layer, the shape and size of the semiconducting layer, the shape, size and the number of the electrodes, and the shape and size of the base or to include or exclude various elements, all within the scope and spirit of this invention. Thus, the invention is to be limited only by the claims set forth below.

What is claimed is:

1. An electrostatic chuck for electrostatically attracting and holding an object, comprising:

a first layer having top and bottom surfaces, the first layer consisting essentially of an insulating material for attracting and supporting such object on its top surface;

a second layer having upper and lower surfaces, the second layer consisting essentially of a semiconducting material, the upper surface of the second layer being in contact with the bottom surface of the first layer;

an electrode formed on the lower surface of the second layer;

supporting means for supporting the first layer, the second layer and the electrode; and electrical connection means for connecting an electric potential between the object and the electrode;

whereby an attractive electrostatic force will be generated between the object and the chuck.

2. An electrostatic chuck as set forth in claim 1 wherein the second layer is a semiconductor having a bulk resistivity between $10^8$ ohm-cm and $10^{13}$ ohm-cm.

3. An electrostatic chuck as set forth in claim 1 wherein the second layer has a thickness greater than 0.005 inches.

4. An electrostatic chuck as set forth in claim 1 wherein the second layer is composed of a material consisting essentially of aluminum oxide and titanium dioxide.

5. An electrostatic chuck as set forth in claim 1 wherein the second layer comprises between 5% and 30% titanium dioxide with the remainder essentially being aluminum oxide.

6. An electrostatic chuck as set forth in claim 1 wherein the first layer consists of a material having a bulk resistivity of greater than about $10^{15}$ ohm-cm.

7. An electrostatic chuck as set forth in claim 1 wherein the first layer has a thickness of between about 0.0005 inches and 0.005 inches.

8. An electrostatic chuck as set forth in claim 1 wherein the first layer consists essentially of aluminum oxide.

9. An electrostatic chuck as set forth in claim 1 wherein the first layer consists essentially of aluminum oxide and the second layer is composed of a material consisting essentially of aluminum oxide and titanium dioxide.

10. An electrostatic chuck for electrostatically attracting and holding an object, comprising a first layer having top and bottom surfaces, the first layer consisting essentially of an insulating material for attracting and supporting the object on the top surface;

a second layer having upper and lower surfaces, the second layer consisting essentially of a semiconductive material, the upper surface of the second layer being in contact with the bottom surface of the first layer;

at least two planar electrodes formed on the lower surface of the second layer and separated by a gap therebetween, the electrodes forming a first and a second capacitor between the electrodes and the work object, wherein portions of the first layer and second layer form a series dielectric between the two capacitors;

supporting means for supporting the electrodes, the second layer and the first layer; and electrical connection means for connecting an electric potential between the at least two electrodes;

whereby an attractive electrostatic force will be generated between the object and the chuck.

11. An electrostatic chuck as set forth in claim 10 wherein the second layer is a semiconductor having a bulk resistivity between $10^8$ ohm-cm and $10^{13}$ ohm-cm.

12. An electrostatic chuck as set forth in claim 10 wherein the second layer has a thickness of greater than 0.005 inches.

13. An electrostatic chuck as set forth in claim 10 wherein the second layer is composed of a material consisting essentially of aluminum oxide and titanium dioxide.

14. An electrostatic chuck as set forth in claim 10 wherein the second layer consists essentially of between 5% and 30% titanium dioxide with the remainder essentially being aluminum oxide.

15. An electrostatic chuck as set forth in claim 10 wherein the first layer consists of a material having a bulk resistivity of greater than about $10^{15}$ ohm-cm.

16. An electrostatic chuck as set forth in claim 10 wherein the first layer has a thickness of between about 0.0005 inches and 0.005 inches.

17. An electrostatic chuck as set forth in claim 10 wherein the first layer consists essentially of aluminum oxide.

18. An electrostatic chuck as set forth in claim 10 wherein the first layer consists essentially of aluminum oxide and the second layer is composed of a material consisting essentially of aluminum oxide and titanium dioxide.

\* \* \* \* \*